United States Patent [19]
Blaugher

[11] Patent Number: 5,882,412
[45] Date of Patent: Mar. 16, 1999

[54] VERTICAL TWO CHAMBER REACTION FURNACE

[75] Inventor: Richard D. Blaugher, Evergreen, Colo.

[73] Assignee: Midwest Research Institute, Kansas City, Mo.

[21] Appl. No.: 6,621

[22] Filed: Jan. 13, 1998

Related U.S. Application Data

[62] Division of Ser. No. 583,341, Jan. 5, 1996, Pat. No. 5,747,099.

[51] Int. Cl.$^6$ ..................................................... C23L 16/00
[52] U.S. Cl. ......................... 118/718; 118/719; 118/724; 118/725
[58] Field of Search ................................... 118/718, 719, 118/724, 725

[56] References Cited

U.S. PATENT DOCUMENTS

| | | | |
|---|---|---|---|
| 4,395,440 | 7/1983 | Abe | 427/255.3 |
| 4,536,419 | 8/1985 | Kubota | 427/255.5 |
| 4,942,152 | 7/1990 | Itozaki | 505/1 |
| 5,034,372 | 7/1991 | Matsuno | 427/62 |
| 5,175,140 | 12/1992 | Fujita | 505/783 |
| 5,276,010 | 1/1994 | Sasaki | 427/62 |
| 5,314,867 | 5/1994 | Hermann | 427/62 |
| 5,360,646 | 11/1994 | Morita | 427/255.3 |
| 5,403,819 | 4/1995 | Makamura | 505/473 |
| 5,480,861 | 1/1996 | Tanaka | 427/62 |

Primary Examiner—Richard Bueker
Attorney, Agent, or Firm—Edna M. O'Connor; Ken Richardson

[57] ABSTRACT

A vertical two chamber reaction furnace. The furnace comprises a lower chamber having an independently operable first heating means for heating the lower chamber and a gas inlet means for admitting a gas to create an ambient atmosphere, and an upper chamber disposed above the lower chamber and having an independently operable second heating means for heating the upper chamber. Disposed between the lower chamber and the upper chamber is a vapor permeable diffusion partition. The upper chamber has a conveyor means for conveying a reactant there through. Of particular importance is the thallinating of long-length thallium-barium-calcium-copper oxide (TBCCO) or barium-calcium-copper oxide (BCCO) precursor tapes or wires conveyed through the upper chamber to thereby effectuate the deposition of vaporized thallium (being so vaporized as the first reactant in the lower chamber at a temperature between about 700° and 800° C.) on TBCCO or BCCO tape or wire (the second reactant) at its simultaneous annealing temperature in the upper chamber of about 800° to 950° C. to thereby replace thallium oxide lost from TBCCO tape or wire because of the high annealing temperature or to deposit thallium on BCCO tape or wire. Continuously moving the tape or wire provides a single-step process that effectuates production of long-length TBCCO superconducting product.

5 Claims, 2 Drawing Sheets

VERTICAL TWO CHAMBER REACTION FURNACE

This is a division of U.S. application Ser. No. 08/583,341, filed Jan. 5, 1996 and incorporates-by-reference in its entirety, all of the contents of Ser. No. 08/583,341 now U.S. Pat. No. 5,747,099.

BACKGROUND OF THE INVENTION

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates in general to a furnace in which chemical or physical reactions occur, and in particular to a two chamber reaction furnace wherein the chambers are disposed substantially vertically in relation to each other and the temperature of each chamber thereof can be individually controlled, with the chambers being separated from each other by a vapor-permeable partition to thereby permit interaction between reactants situated in different chambers. Also included is methodology for the interaction of reactants.

II. Description of the Prior Art

In certain chemical and physical reactions between one or more reactants, it is not unusual for reactants to require two or more different temperatures, all above ambient, for steps of a reaction to proceed. When this is the case, current single-chamber, and therefore single-temperature, furnaces require multi-step procedures to accomplish complete reactions. Such multi-step procedures can include heating a first reactant at a given temperature for an appropriate time period in a furnace, and thereafter either increasing or decreasing the furnace temperature before adding a second reactant to the furnace for a second period of time. As is apparent, such a multi-step process is both inconvenient, time-consuming, and energy inefficient while additionally requiring invasion of the furnace chamber when reactants are incompletely reacted.

Current two-zone furnaces having a first temperature zone and a second temperature zone in horizontal relationship to each other permit vaporization of a material in one zone and vapor travel to the second zone for subsequent deposition thereof. However, one major drawback of horizontal zones is that vapor deposition is not uniform, but instead a gradient of deposition quantity occurs as the vapor travels horizontally through the second temperature zone.

Exemplification of a process wherein reactants thereof require different activation temperatures in order to yield the required end product is found in the manufacture of thallium-barium-calcium-copper oxide (TBCCO) substrates having superconducting properties. In particular, a TBCCO substrate is first annealed at temperatures of about 800° to 900° C., at which temperature thallium is highly volatile and can be lost from the substrate. Accordingly, an external source of thallium is usually needed to compensate for any thallium loss. In a single-chamber, fixed temperature furnace, this external source is usually vaporized thallium derived from a thallium source identical to the composition of the end-product to be produced. The thallium source is heated to a temperature between about 700° and 800° C., thus about 100° less than the annealing temperature. In a single-chamber furnace, the initial TBCCO reactant is therefore annealed first at the higher temperature. Thereafter, at the lower temperature, the initial TBCCO reactant is exposed to thallium vapor which is normally combined with an oxygen background pressure and flow. Simultaneous annealing and thallium replacement thus cannot occur in a single-chamber furnace to produce the final TBCCO substrate end-product. Employment of a two-zone horizontal furnace permits simultaneous vaporization and deposition, but, as earlier noted, creates a deposition gradient and resultant non-uniformity of desired end-product.

In view of the above, it is evident that a need is present for a two-chamber furnace where reactants therein can simultaneously react uniformly to completion when different temperature values are required for respective reactants. Therefore, a primary object of the present invention is to provide a two-chamber reaction furnace wherein the chambers are situated substantially vertically in relation to each other and wherein the temperature of each chamber can be individually controlled.

Another object of the present invention is to provide a vertical two chamber furnace wherein the chambers are separated from each other by a vapor-permeable partition to thereby permit interaction between reactants situated in different chambers and at different temperatures.

Yet another object of the present invention is to provide methodology for producing a product wherein a first reactant thereof requires a first temperature while a second reactant thereof whose vapor is to be deposited on the first reactant is so vaporized simultaneously at a second temperature.

These and other objects of the present invention will become apparent throughout the description of the invention which now follows.

SUMMARY OF THE INVENTION

The present invention is a vertical two chamber reaction furnace. The furnace comprises a lower chamber having an independently operable first heating means for heating the lower chamber and a gas inlet means for admitting a gas to create an ambient atmosphere, and an upper chamber disposed above the lower chamber and having an independently operable second heating means for heating the upper chamber. Disposed between the lower chamber and the upper chamber is a vapor permeable diffusion partition. In a preferred embodiment each chamber has a respective support means for supporting a respective reactant situatable thereon. Additionally, the upper chamber can have a conveyor means for conveying a reactant from a first location outside of the furnace through the upper chamber of the furnace to a second location outside of the furnace.

The present invention additionally comprises a process for depositing a vaporizable first reactant on a second reactant wherein the vaporizable first reactant volatilizes at a first temperature and deposition of that first reactant on the second reactant occurs simultaneously at a second temperature. The process comprises providing a vertical two chamber furnace as defined above and placing a vaporizable first reactant within the lower chamber and placing a second reactant within the upper chamber. The lower chamber is heated to a temperature sufficient to vaporize the vaporizable reactant within the lower chamber while admitting oxygen and/or an inert gas as required to effectuate such vaporization, with vapor thereof passing through the partition into the upper chamber. The upper chamber is heated to a temperature sufficient to react the second reactant while the vaporized reactant passes through the partition and is deposited simultaneously on the second reactant within the upper chamber. Of particular importance is the thallinating of long-length TBCCO precursor tapes or wires, which can be thallium-free (e.g. barium-calcium-copper oxide [BCCO]) or can contain thallium (e.g. TBCCO), conveyed through the upper chamber via the conveyor means to thereby effectuate the deposition of vaporized thallium (being so vaporized as the first reactant in the lower chamber at a temperature between about 700° and 800° C.) on TBCCO tape or wire (the second reactant) at its simultaneous annealing temperature in the upper chamber of about 800° to 950° C. to thereby replace thallium oxide lost from the initial second reactant because of the high annealing temperature. Compounds of other metals, such as the substitution of Sr, Pb and Bi for the Tl, Ba and Ca of TBCCO for example, can, of course, change the reaction temperature. In the substitution example given, the reaction temperature is higher. The tape or wire is continuously moved by the conveyor means to yield a single-step process that effectuates production of long-length TBCCO superconducting product.

BRIEF DESCRIPTION OF THE DRAWINGS

An illustrative and presently preferred embodiment of the invention is shown in the accompanying drawings in which.

DETAILED DESCRIPTION OF THE PREFERRED EMBODIMENT

Figure 1:
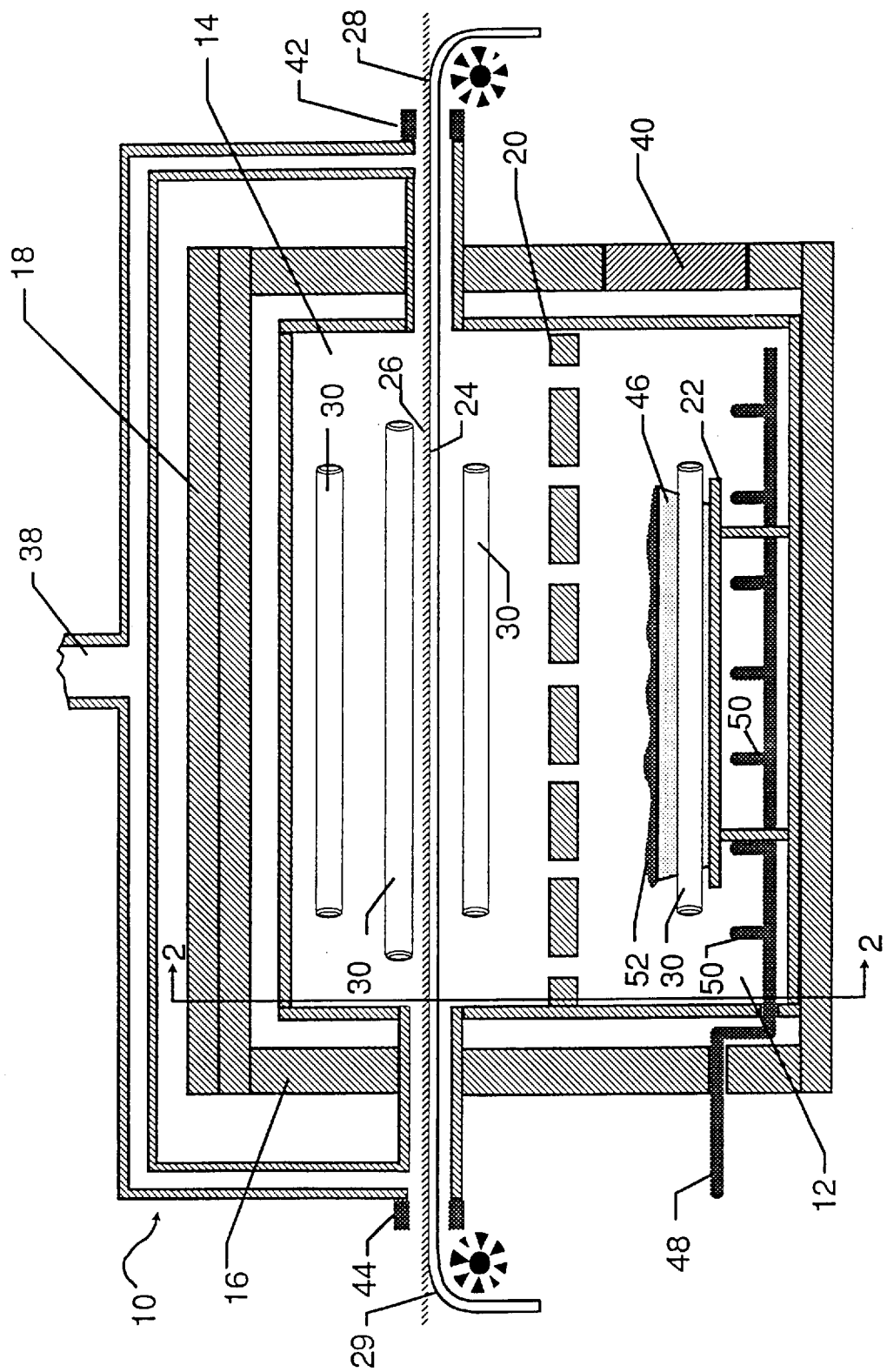
FIG. 1 is a front elevation view schematically in section of a two chamber furnace.
Figure 2:
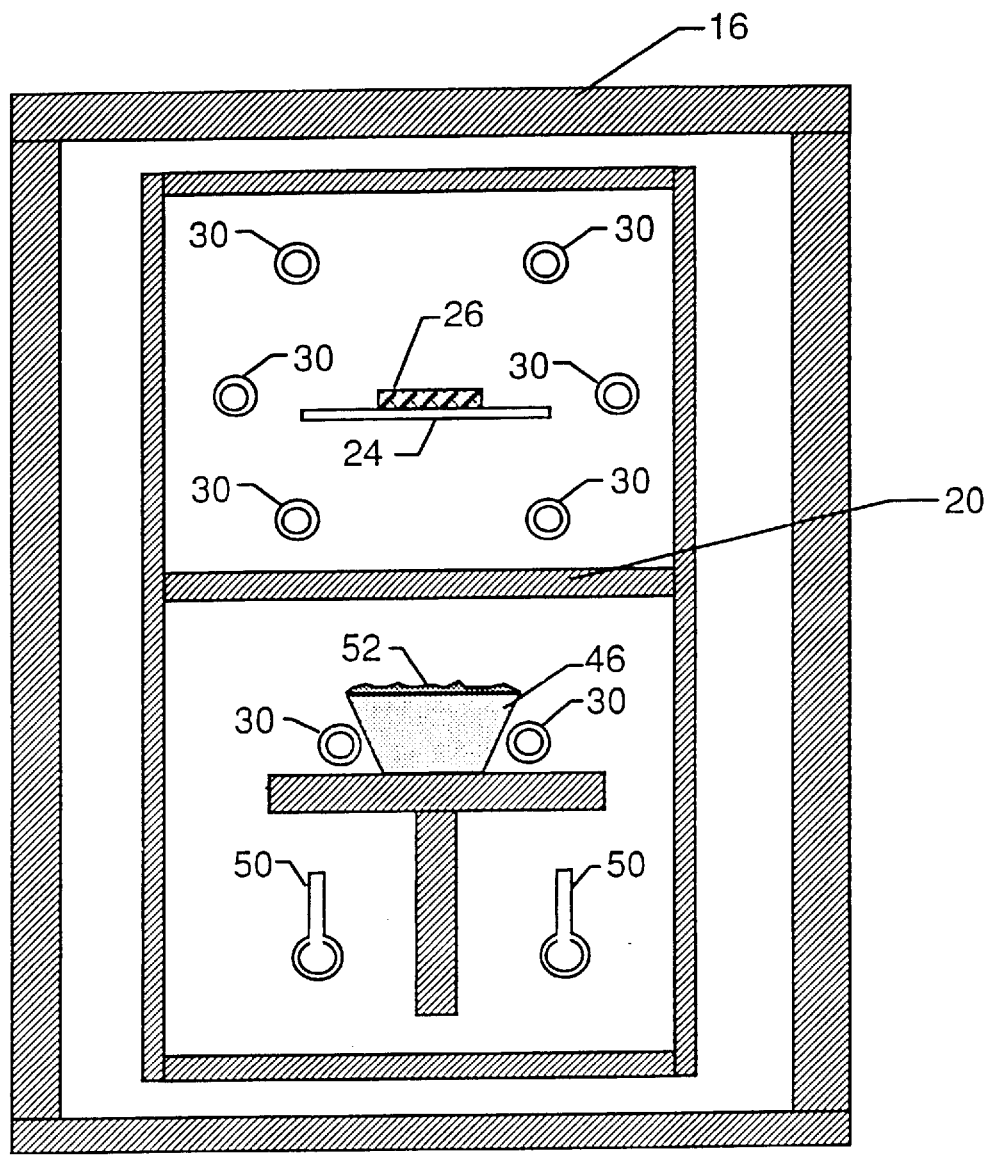
FIG. 2 is an end elevation view along line 2—2 of FIG. 1.

Referring to FIGS. 1 and 2, a furnace 10 is shown schematically. The furnace 10 has a lower chamber 12 and an upper chamber 14, with the upper chamber 14 disposed above the lower chamber 12. The wall 16 of the furnace 10 is constructed of tubular stainless steel and is openable at its top 18. Disposed between the two chambers 12, 14 is a vapor permeable partition 20 here constructed of baffles which function to admit vapor from a reactant in the lower chamber 12 to pass into the upper chamber 14. A typical exhaust stack 38 is provided.

Disposed within the lower chamber 12 is a fixed platform 22 which functions as a first support means upon which a first reactant can be situated. A gas inlet 48 enters the lower chamber 12, and has a plurality of dispersion nozzles 50 therein to permit entry of a gas as desired to create a specific ambient atmosphere depending upon the requirements of the reactant(s) there present. Access to the lower chamber 12 can be accomplished through an access port 40 located in alignment with the platform 22. Disposed within the upper chamber 14 is a second support means which can be a fixed platform or, as here shown, a conveyor means including a conveyor belt 24 for conveying a second reactant such as a length of tape 26 from a first location 28 outside of the furnace 10 through the upper chamber 14 to a second location 29 outside of the furnace 10. Access to the upper chamber 14 for both the conveyor belt 24 and the second reactant thereon is through respective baffles 42, 44 having respective gas blankets and situated through duct components of the exhaust stack 38. Movement of the conveyor belt 24 is accomplished by conventional means such as a motor powered by electricity. Respective ceramic heating elements 30, here being "Globar" elements manufactured by Cesiwid Company, Niagara Falls, N.Y., are disposed near both the first and second support means to thereby provide respective isothermal reaction regions within which the reactants reside during reaction events. These Globar elements can be sheathed with aluminum oxide to minimize any degradation thereof which may occur in a corrosive environment.

Operation of the furnace 10 is exemplified in the preparation of a continuous length of TBCCO tape, as described below.

EXAMPLE

The respective heating elements 30 in both the lower chamber 12 and upper chamber 14 of the furnace 10 were activated to heat the lower chamber 12 to a temperature of between about 700° and 800° C. and to heat the upper chamber 14 to a temperature between about 800° and 950° C. An alumina boat 46 housing thallium oxide 52 was placed within the lower chamber 12 on the platform 22 within the isothermal reaction region, and oxygen gas was admitted through the gas inlet 48 and dispersion nozzles 50 to thereby provide partial pressure control for the thallium and oxygen within the lower chamber 12. A length of TBCCO or BCCO tape 26 was placed on the conveyor belt 24 at a first location 28 and was thereafter conveyed into (and subsequently through) the isothermal reaction region of the upper chamber 14. The TBCCO or BCCO tape 26 was annealed in the upper chamber 14 at the set temperature of 800° to 900° C., with a portion of the thallium of the tape 26 being lost therefrom because of the high annealing temperature. Simultaneously, the thallium oxide 52 within the alumina boat 46 situated in the lower chamber 12 was vaporizing, and the vapor therefrom passed through the vapor permeable partition 20 into the upper chamber 14 to effectively replace or maintain the initial thallium lost from the TBCCO tape or to incorporate thallium on the BCCO tape and thereby produce a TBCCO tape having the required thallium value for efficacy. After a reaction time of one to 60 minutes, depending on the film thickness desired, the segment of tape 26 so reacted passes onward to a final destination outside the furnace 10 at the second location 29. In this manner an operator can effectuate the thallinating of long-length precursor tape or wire to produce a uniform superconducting product quickly and efficiently because of annealing of precursor tape or wire and simultaneous thallium deposition thereon accomplishable in the vertical two chamber furnace 10.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

I claim:

1. A substantially vertical two chamber reaction furnace comprising a lower chamber having an independently operable first heating means for heating the lower chamber and a gas inlet means for admitting a gas to create an ambient atmosphere, an upper chamber disposed above the lower chamber and having an independently operable second heating means for heating the upper chamber, and a vapor permeable diffusion partition disposed between the lower chamber and the upper chamber.

2. A two chamber reaction furnace as claimed in claim 1 having in addition a conveyor means for conveying a reactant from a first location outside of the furnace through the upper chamber of the furnace to a second location outside of the furnace.

3. A two chamber reaction furnace as claimed in claim 2 wherein a first support means is disposed within the lower chamber to support a first reactant situatable thereon.

4. A two chamber reaction furnace as claimed in claim 3 wherein a second support means is disposed within the upper chamber to support a second reactant situatable thereon.

5. A two chamber reaction furnace as claimed in claim 4 wherein the second support means comprises a conveyor means for conveying a second reactant from a first location outside of the furnace through the upper chamber of the furnace to a second location outside of the furnace.

\* \* \* \* \*